US008483933B2

(12) United States Patent
Lehr et al.

(10) Patent No.: US 8,483,933 B2
(45) Date of Patent: Jul. 9, 2013

(54) METHOD FOR OPERATING A FUEL INJECTOR

(75) Inventors: Hans-Peter Lehr, Stuttgart (DE); Erik Tonner, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 631 days.

(21) Appl. No.: 12/304,529

(22) PCT Filed: Nov. 23, 2007

(86) PCT No.: PCT/EP2007/062730

§ 371 (c)(1),
(2), (4) Date: Mar. 3, 2009

(87) PCT Pub. No.: WO2008/071532

PCT Pub. Date: Jun. 19, 2008

(65) Prior Publication Data

US 2011/0180046 A1 Jul. 28, 2011

(30) Foreign Application Priority Data

Dec. 12, 2006 (DE) ........................ 10 2006 058 742

(51) Int. Cl.

| | |
|---|---|
| ***B60T 7/12*** | (2006.01) |
| ***G05D 1/00*** | (2006.01) |
| ***G06F 7/00*** | (2006.01) |
| ***G06F 17/00*** | (2006.01) |
| ***F02M 51/00*** | (2006.01) |
| ***H01L 41/00*** | (2006.01) |
| ***H02N 2/00*** | (2006.01) |

(52) U.S. Cl.

USPC ......... 701/103; 123/488; 239/102.2; 310/317

(58) Field of Classification Search

USPC ....... 123/498, 480, 478, 499, 490; 239/102.2, 239/585.1; 310/316.03, 317, 323.06, 311; 701/103

See application file for complete search history.

(56) References Cited

U.S. PATENT DOCUMENTS

| | | | | |
|---|---|---|---|---|
| 2007/0251492 | A1 * | 11/2007 | Beilharz et al. | 123/339.14 |
| 2010/0059021 | A1 * | 3/2010 | Rau et al. | 123/478 |

FOREIGN PATENT DOCUMENTS

| | | | |
|---|---|---|---|
| DE | 10 2006 003 861 | | 8/2007 |
| EP | 1 172 541 | | 1/2002 |
| EP | 1519026 | * | 9/2004 |
| EP | 1 519 026 | | 3/2005 |
| JP | 2004-320869 | | 11/2004 |
| WO | WO 03/027468 | | 4/2003 |
| WO | WO 03/081007 | | 10/2003 |

OTHER PUBLICATIONS

Susan R. Curtis, Alan V. Oppenheim, and Jae S. Lim, Reconstruction of Two-Dimensional Signals From Threshold Crossings 1985.*

International Search Report, PCT/EP2007/062730 dated Mar. 11, 2008.

* cited by examiner

*Primary Examiner* — Stephen K Cronin
*Assistant Examiner* — Sherman Manley
(74) *Attorney, Agent, or Firm* — Kenyon & Kenyon LLP

(57) ABSTRACT

A method is for operating a fuel injector, in particular of an internal combustion engine of a motor vehicle, the fuel injector including a piezoelectric actuator for driving a valve needle, which is connected, preferably hydraulically, to the actuator, and the control voltage of the piezoelectric actuator being analyzed to infer an operating state of the fuel injector. According to this method, the second time derivative of the control voltage and/or a variable depending on the second time derivative of the control voltage is/are analyzed.

21 Claims, 5 Drawing Sheets

METHOD FOR OPERATING A FUEL INJECTOR

FIELD OF THE INVENTION

The present invention relates to a method for operating a fuel injector, in particular in an internal combustion engine of a motor vehicle, the fuel injector having a piezoelectric actuator for driving a valve needle connected, preferably hydraulically, to the actuator, and a trigger voltage of the piezoelectric actuator being analyzed to infer the operating state of the fuel injector.

BACKGROUND INFORMATION

Such a method is described in DE 10 2006 003 861. In this method, a voltage applied to the piezoelectric actuator after triggering of the actuator is checked for deviations from a predefinable voltage value to infer a closing instant of a nozzle needle of the fuel injector.

SUMMARY

Example embodiments of the present invention provide a method of the type defined in the introduction so that more accurate information about an operating state of the fuel injector is obtained.

According to example embodiments of the present invention, a method of the type defined at the outset includes analyzing the second time derivative of the trigger voltage and/or a variable depending on the second time derivative of the trigger voltage.

Through the analysis of the second time derivative of the trigger voltage of the piezoelectric actuator and/or a variable depending thereon according to the present invention, an accurate conclusion about characteristic operating states of the piezoelectric actuator and/or the valve needle connected to it and about the fuel injector as a whole is possible.

A zero crossing of the second time derivative, in particular from positive values to negative values, may advantageously be ascertained in particular during the opening of the fuel injector to infer a characteristic operating state. There is a feedback effect of the valve needle on the piezoelectric actuator after a certain period of time during the opening of the fuel injector, this being detectable based on the aforementioned zero crossing of the second time derivative of the trigger voltage of the piezoelectric actuator. This feedback effect corresponds to a characteristic operating state of the fuel injector and the analysis according to example embodiments of the present invention thus allows accurate monitoring of the corresponding operating state.

Furthermore, it is possible in a particularly advantageous manner for a maximum of the second time derivative to be ascertained, in particular during the closing of the fuel injector, to infer a characteristic operating state. Diring a closing operation of the fuel injector, the valve needle striking its closing seat and the associated sudden deceleration of the valve needle in turn result in a feedback effect on the piezoelectric actuator in the form of the maximum described above. The analysis according to example embodiments of the present invention for such a maximum allows accurate monitoring of the instant at which the valve needle has reached its closing seat.

A simple and at the same time particularly accurate analysis may be performed if the trigger voltage of the piezoelectric actuator is sampled, preferably at a fixed sampling frequency and if the variable depending on the second time derivative of the trigger voltage is formed from the sampling values thereby obtained.

The variable depending on the second time derivative of the trigger voltage is advantageously obtained by the following equation in particular:

$$ddu[k]=(u[k+j]-u[k+1])-(u[k]-u[k-j+1])$$

where u[k] is a sampling value for the trigger voltage at a discrete instant k, and where j is a predefinable constant for which it holds that j=5, for example. A method that is particularly easy and efficient to implement is to ascertain the variable which depends on the second time derivative of the trigger voltage using the equation given above according to example embodiments of the present invention, to obtain the information in question by using a computation unit, such as that provided in a control unit for operation of the fuel injector. This allows more accurate recognition of breaks in the signal curve in the case of sampled signals than by analysis of the mathematically accurate second derivative.

Operation of the fuel injector is regulated as a function of the second time derivative of the trigger voltage and/or of the variable depending on the second time derivative of the trigger voltage in a particularly advantageous manner. In doing so, the information about the operating state(s) of the fuel injector obtained according to example embodiments of the present invention may be advantageously used to achieve a predefinable operating performance, in particular one that is constant over time, and to compensate for manufacturing-related tolerances, aging effects and the like.

To achieve the desired operating performance of the fuel injector, a charging current and/or a discharge current, in particular the corresponding threshold values, are advantageously predefined.

Furthermore, it may also be advantageous to predefine a charging time for charging the piezoelectric actuator to be sure that the piezoelectric actuator is fully charged for subsequent triggering back to the corresponding nominal voltage and/or output voltage. It is also possible to predefine a discharge time accordingly. Alternatively or in addition to predefining a charging time and/or discharge time, a certain trigger voltage may also be predefined as a cutoff criterion for a discharge operation and/or a charging operation.

An increase in the reliability of the method according to example embodiments of the present invention is obtained because the analysis is performed in only one or more predefinable time windows.

Implementation of the method according to example embodiments of the present invention in the form of a computer program capable of running on a computer and/or a computation unit of a control unit and suitable for executing the method is of particular importance. The computer program may be stored on an electronic storage medium, for example, such that the storage medium may in turn be contained in the control unit, for example.

Additional advantages, features and details are derived from the following description in which various exemplary embodiments of the present invention are depicted with reference to the drawings. The features mentioned may be provided either individually or in any combination.

DETAILED DESCRIPTION

Figure 1:
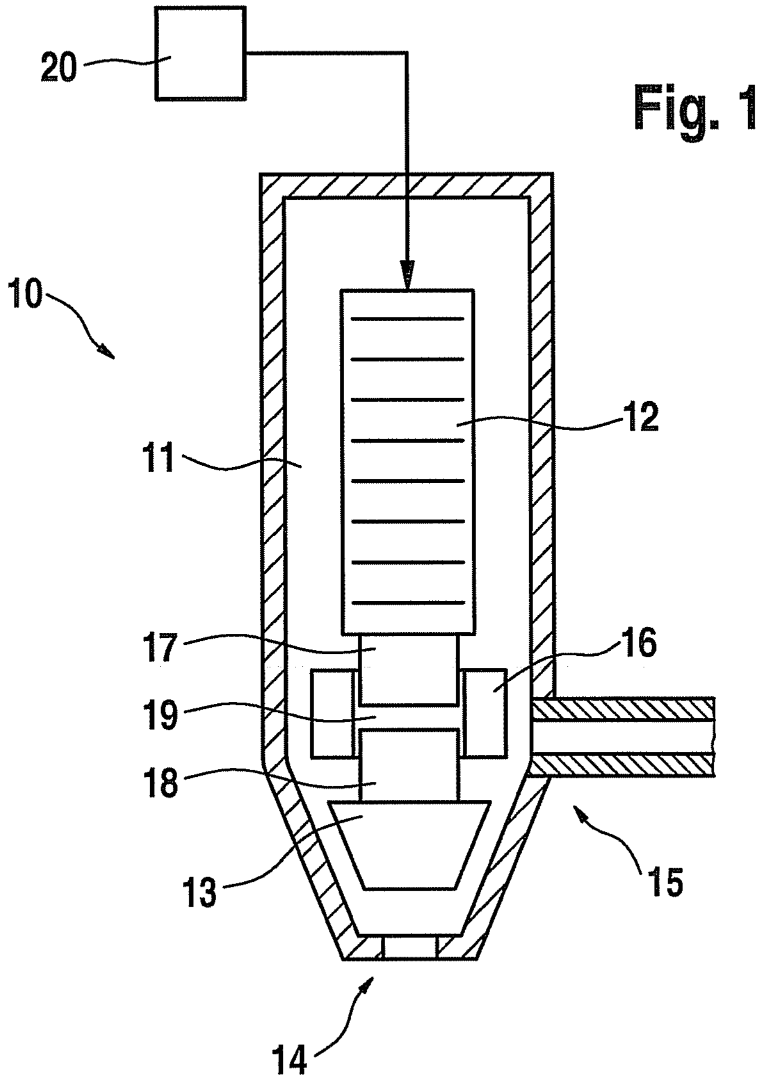
FIG. 1 shows a schematic sectional diagram of an exemplary embodiment of a fuel injector for implementing the method according to example embodiments of the present invention, FIG. 2*a* schematically shows a time characteristic of a trigger voltage of a piezoelectric actuator of the fuel injector from FIG. 1, FIG. 2*b* schematically shows a time characteristic of a trigger current of the piezoelectric actuator, FIGS. 3*a* and 3*b* schematically show a time characteristic of a variable depending on the second time derivative of the trigger voltage and analyzed according to example embodiments of the present invention, and FIGS. 4*a* through 4*d* schematically show a time characteristic of a needle stroke of a valve needle.

FIG. 1 shows a fuel injector 10 of a motor vehicle equipped with a piezoelectric actuator 12. Piezoelectric actuator 12 is triggered by a control unit 20, as indicated by the arrow in FIG. 1. Furthermore, fuel injector 10 has a valve needle 13, which may sit on a valve seat 14 in the interior of the housing of fuel injector 10.

If valve needle 13 is lifted up from valve seat 14, fuel injector 10 is opened and fuel is injected. This state is depicted in FIG. 1. If valve needle 13 is seated on valve seat 14, fuel injector 10 is closed. The transition from the closed state to the open state is accomplished with the help of piezoelectric actuator 12. To do so, an electric voltage, also referred to below as trigger voltage U, is applied to actuator 12 and induces a change in length of a piezostack situated in actuator 12, the piezostack in turn being utilized to open and/or close fuel injector 10.

Fuel injector 10 also has a hydraulic coupler 15. For this purpose, a coupler housing 16, in which two pistons 17, 18 are guided, is provided inside fuel injector 10. Piston 17 is connected to actuator 12 and piston 18 is connected to valve needle 13. A volume 19 is enclosed between two pistons 17, 18 and transfers the force exerted by actuator 12 to valve needle 13.

Coupler 15 is surrounded by fuel 11 under pressure. Volume 19 is also filled with fuel. Volume 19 may adapt to the particular length of actuator 12 for a longer period of time via the guide gap between two pistons 17, 18 and coupler housing 16. However, volume 19 remains almost unchanged in the case of brief changes in the length of actuator 12, and the change in length of actuator 12 is transferred to valve needle 13.

To obtain information about an operating state of fuel injector 10, the method according to example embodiments of the present invention is performed as described below, this method being stored in the form of a computer program on an electronic memory element (not shown) and optionally being provided in control unit 20 to be processable by a computation unit of control unit 20.

Figures 2A, 2B:
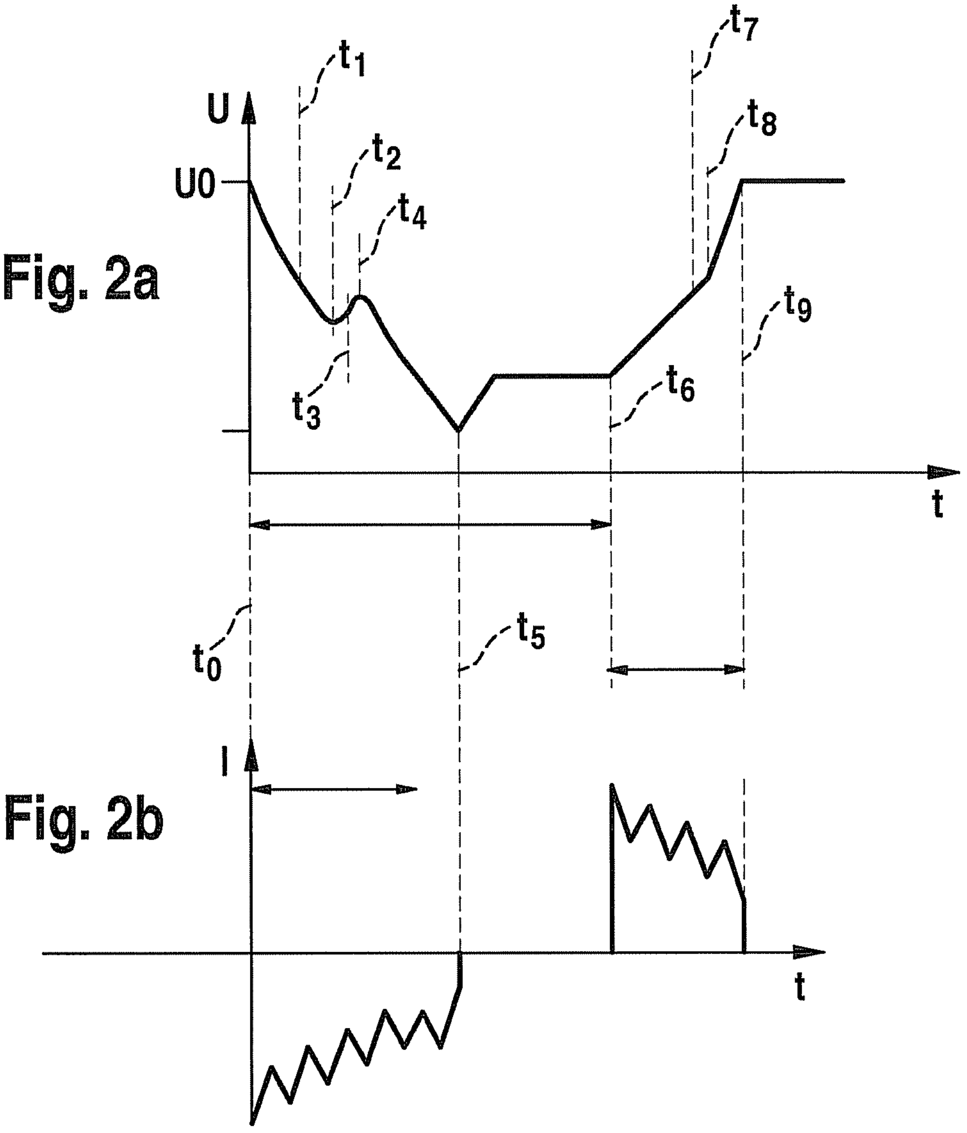

FIG. 2*a* schematically shows the time characteristic of trigger voltage U with which actuator 12 is triggered to induce the opening and subsequent closing of fuel injector 10 (FIG. 1) and thus to trigger fuel injection.

At the start of the triggering operation at t=t0, actuator 12 is charged to an output voltage U0 and thus is at its maximum length and/or maximum actuator stroke, so that valve needle 13, which is linked to actuator 12 (FIG. 1), is in contact with its valve seat and/or closing seat 14, and fuel injector 10 is closed accordingly.

Subsequent discharging of actuator 12 initially causes a drop in trigger voltage U in time interval [t0, t2]. During this time, actuator 12 has become accordingly shorter so that valve needle 13 has been moved away from its valve seat 14. Investigations by the applicant have shown that approximately after instant t2, moving valve needle 13 has a feedback effect on coupler 15 and thus also on actuator 12, possibly resulting in a temporary increase in trigger voltage U in interval of time [t2, t4]. The continued discharge causes a further drop in trigger voltage U by instant t5, which represents the end of the discharge operation.

Subsequent charging of actuator 12 takes place starting at instant t6 to instant t9, valve needle 13 having already reached its valve seat 14 again at instant t7 and being greatly decelerated accordingly. This results in another corresponding feedback effect of valve needle 13 on actuator 12 coupled to it, thereby lowering its electric capacitance. Consequently, trigger voltage U rises more steeply after instant t8 than previously, i.e., at times t<t7, although for trigger current I there is no essential change (see FIG. 2*b*). Discharging is concluded at instant t9, when trigger voltage U again has its output value U0 which is required for the next fuel injection.

According to example embodiments of the present invention, the second time derivative of trigger voltage U and/or a variable depending on the second time derivative of trigger voltage U is/are advantageously analyzed to detect the feedback effect of valve needle 13 at instant t4.

Trigger voltage U is preferably sampled, in particular at a fixed sampling frequency, and a variable ddu, which depends on the second time derivative of trigger voltage U, is formed from sampling values u[k] thereby obtained. The sampling frequency may be 200 kHz, for example.

Variable ddu, which depends on the second time derivative of trigger voltage U, is obtained from individual sampling values u[k] using the following equation:

$$ddu[k]=(u[k+j]-u[k+1])-(u[k]-u[k-j+1]),$$

where u[k] denotes a sampling value for trigger voltage U at a discrete instant k, and where j is a predefinable constant, for which it holds that j=5, for example. Formation of variable ddu is expedient in particular because it requires only addition and/or subtraction and thus may be performed rapidly and efficiently by a computation unit of control unit 20 accordingly.

Figure 3A:
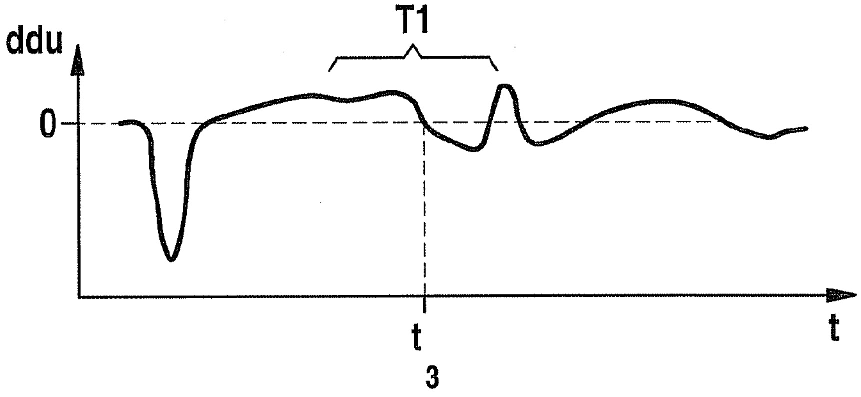
Figure 3B:
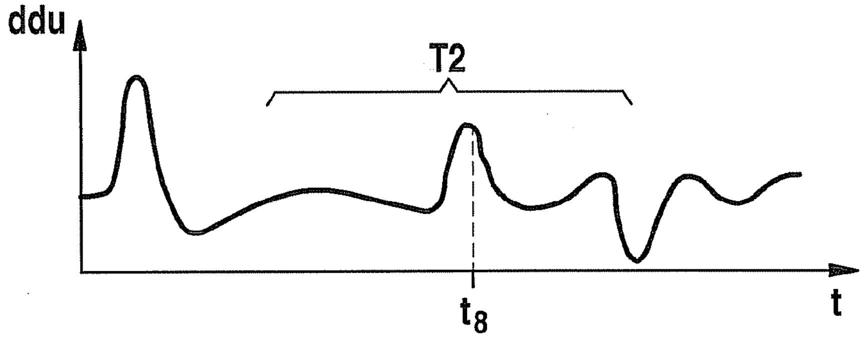

A schematic time characteristic of variable ddu is given in FIG. 3*a* for the opening operation of fuel injector 10 (cf. interval of time [t0, t5] from FIG. 2*a*) and is given in FIG. 3*b* for the closing operation of fuel injector 10 (cf. interval of time [t6, t9] from FIG. 2*a*), where discrete instants k correspond to the corresponding values of time t plotted on the abscissa.

As FIG. 3*a* shows, variable ddu to be considered according to example embodiments of the present invention has a zero crossing from positive to negative values at instant t3 (see also FIG. 2*a*), this crossing being ascertained and/or analyzed as part of the analysis according to the present invention. By ascertaining chronological position t3 of this zero crossing, a characteristic operating state of fuel injector 10 may be ascertained independently of wear phenomena or changes in operating conditions, this operating state corresponding to approximately half a maximum stroke of valve needle 13.

In other words, instant t3 of the zero crossing of variable ddu indicates the instant at which valve needle 13 has completed half its maximum stroke, regardless of altered operating conditions and wear phenomena. The chronological correspondence of half the maximum stroke and the turning point in trigger voltage U and/or the zero crossing of variable ddu are applicable for the design of fuel injector 10 described here. In principle, the actuator stroke may also equal a different percentage amount of the maximum stroke on occurrence of the turning point in trigger voltage U.

Analogously, as shown in FIG. 3*b*, there is a maximum for variable ddu during the closing of fuel injector 10 and this maximum corresponds to the break in trigger voltage U in the range of instant t7, t8 (see FIG. 2*a*). In other words, by ascertaining instant t8 at which the maximum of variable ddu occurs, it is possible to determine the instant of the actual closing of fuel injector 10, at which valve needle 13 has reached its valve seat 14, regardless of altered operating conditions and wear phenomena.

Thus, the corresponding operating state of fuel injector 10 may always be determined by analyzing variable ddu independently of operating conditions and age phenomena, which vary over time and involve in particular an electric capacitance or a lift capacity of actuator 12, valve seat 14, etc.

Operation of fuel injector 10 is regulated in a particularly advantageous manner as a function of variable ddu and/or its analysis. Therefore, it is possible to regulate the zero crossing (see FIG. 3*a*) and/or the maximum (see FIG. 3*b*) to occur at a particular determined fixed instant t3, t8, for example, so that the corresponding operating state is also always established at these instants t3, t8.

In other words, the turning point in trigger voltage U, instant t3, and the break in the closing operation, instant t8, may be equated in time for successive fuel injection operations—with regard to an onset of triggering t0 so that a uniform time characteristic of the needle stroke of valve needle 13 is achievable over almost the entire lifetime of fuel injector 10 and corresponds to a corresponding uniform injected quantity of fuel. This effectively prevents drift in the quantity of fuel injected due to mechanical wear and aging, i.e., fatigue, of actuator 12.

To achieve chronological equality of the characteristic operating state, for example, charging current and/or discharge current I (FIG. 2*b*) may be adjusted accordingly. In particular, threshold values provided for charging current and/or discharge current I may be set as a function of variable ddu and/or its time characteristic.

The charging time during which actuator 12 is recharged after being discharged may also be regulated to be sure that actuator 12 is charged up again after the actual closing of fuel injector 10 at instant t8 (FIG. 2*a*) until reaching output voltage U0, which is required for a subsequent fuel injection operation.

It is possible in general to use the operating states ascertained using the method according to the present invention and/or to use the correlating breaks and/or turning points in the time characteristic of trigger voltage U as regulating features and to link them with different manipulated variables such as the start of triggering, for example. The turning point in trigger voltage U during the opening of fuel injector 10 may be preferably linked to the start of triggering, and a break in trigger voltage U during closing of fuel injector 10 may be linked to the duration of triggering.

Particularly reliable detection of the characteristic operating states of fuel injector 10 is ensured when the analysis of variable ddu is performed only in predefinable time windows following a zero crossing and/or a maximum. The time windows are preferably to be selected as a function of actual triggering of actuator 12 in an advantageous manner, so that the features of the zero crossing and/or maximum that are to be ascertained occur in the time window as unambiguously as possible. For example, two such time windows T1, T2 are represented by curly brackets in FIGS. 3*a*, 3*b*.

Figure 4A:
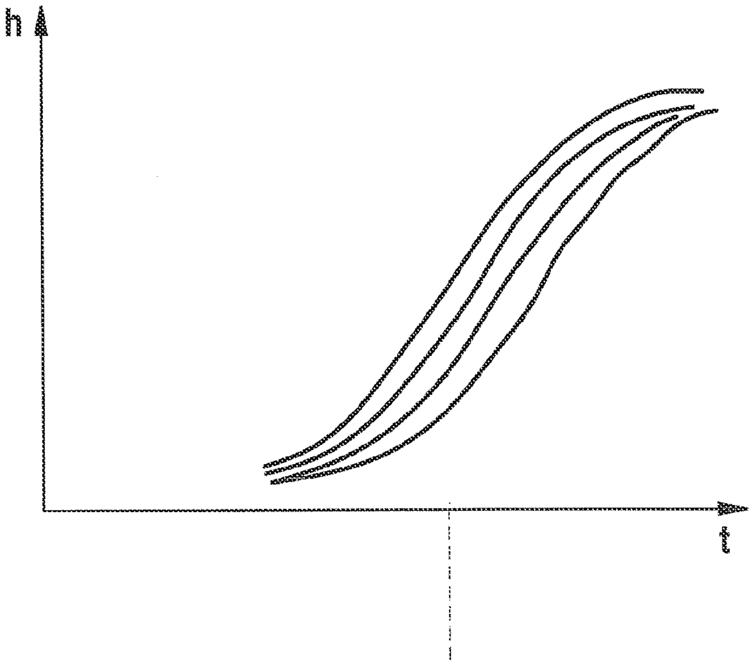
Fig. 4a Prior Art

In a total of four curves, FIG. 4*a* schematically shows a time characteristic of needle stroke h of valve needle 13 as it occurs under different operating conditions and/or different wear states without the use of the method according to the present invention when opening a fuel injector. As shown in FIG. 4*a*, there are very different time characteristics for needle stroke h and thus also accordingly different injected fuel quantities depending on the operating conditions and/or wear state.

Figure 4B:
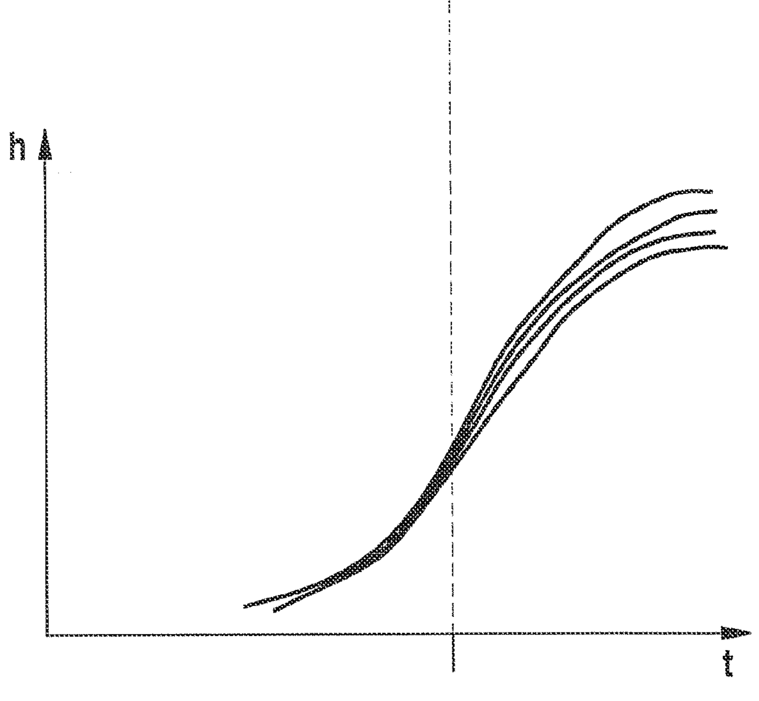

According to example embodiments of the present invention, the time equality of the turning point of trigger voltage U at instant t3 results in a much more uniform needle stroke characteristic h, as shown in FIG. 4*b*, under different operating conditions and/or with a different wear state.

Figure 4C:
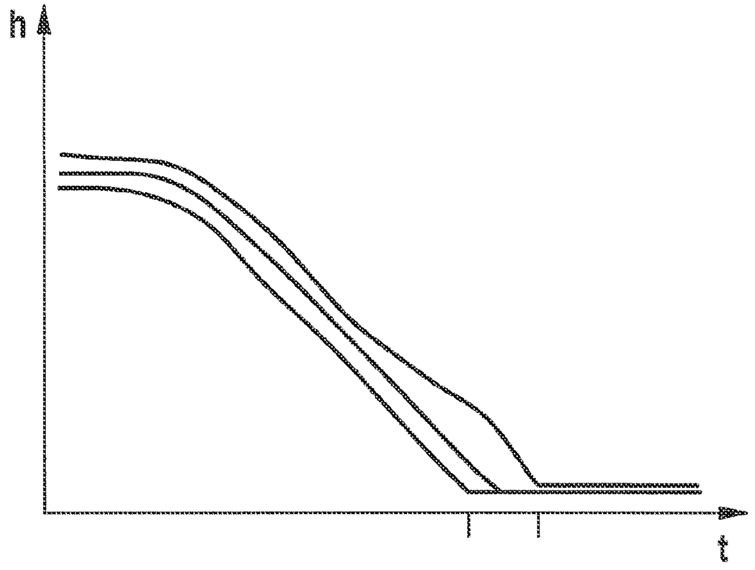
Fig. 4c Prior Art
Figure 4D:
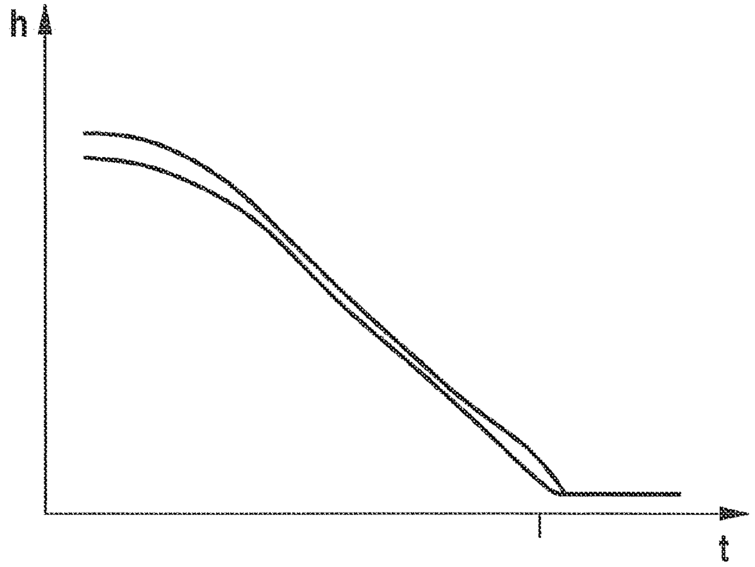

FIG. 4*c* schematically shows a time characteristic of needle stroke h of valve needle 13 as it occurs under different operating conditions and/or different wear states without the use of the method according to example embodiments of the present invention when closing a fuel injector. As FIG. 4*c* shows, there are very different time characteristics for needle stroke h and thus also accordingly different injected fuel quantities depending on the operating conditions and/or wear state According to example embodiments of the present invention, the time equality of the break in trigger voltage U at instant t8 results in a much more uniform needle stroke characteristic h, as illustrated in FIG. 4*d*, even under different operating conditions and/or wear states and thus results in an injected fuel quantity that is largely independent of different operating conditions and/or wear states.

The time equality of the operating states of fuel injector 10 described above allows the quantity of fuel injected to be maintained accurately over the entire operating time and/or lifetime of fuel injector 10 if the injection rate remains almost constant in the opened state.

In addition to the advantageous time equality of characteristic operating states of fuel injector 10 based on variable ddu and a corresponding regulation, the method according to example embodiments of the present invention also allows desired valve needle dynamics to be predefined by setting charging current and/or discharge current I.

The break in trigger voltage U, which occurs in time interval [t7, t9] in the present example according to FIG. 2*a*, may occur at high trigger currents I and even after the end of electric current feed, i.e., at t>t9 in FIG. 2*a* depending on the design of the hydraulic component of fuel injector 10. Again in this case, the break in trigger voltage U may be recognized by the method according to example embodiments of the present invention described above and used as a regulating feature.

The method according to example embodiments of the present invention may also be advantageously used to recognize an operating state of fuel injector 10 in which valve needle 13 reaches a stroke stop during opening. The stroke stop (not shown) limits in particular the movement of valve needle 13 to a maximum stroke, which corresponds to the completely open state of fuel injector 10. The feedback effect of valve needle 13 on piezoelectric actuator 12 changes on reaching the stroke stop in such a way that the change in trigger voltage U over time undergoes a corresponding relatively great change. This change is advantageously recognized as a local minimum in the second time derivative of trigger voltage U, so that by using the method according to example embodiments of the present invention, it is possible to determine when the stroke stop is actually reached by valve needle 13.

As already described in conjunction with the additional operating states of fuel injector 10 that are of interest, by stipulating corresponding manipulated variables, the instant at which valve needle 13 reaches the stroke stop may thus also be advantageously regulated, thereby increasing the accuracy during injection of the fuel quantity. A time equality for valve needles 13 of multiple fuel injectors 10 reaching the needle stroke stop may be implemented by way of a corresponding regulation in particular through the analysis of the local minimum of the second time derivative of trigger voltage U corresponding to the reaching of the needle stroke stop.

An electric current feed of piezoelectric actuator 12, which is necessary for opening fuel injector 10, is ended at instant t5 in the exemplary embodiment described above (see FIG. 2*b*). As of this instant t5, valve needle 13 first moves further toward the stroke stop in the direction of opening and in doing so exerts pressure on piezoelectric actuator 12, which results in an increase in trigger voltage U immediately after instant t5 (see FIG. 2*a*). As soon as valve needle 13 has reached its stroke stop, trigger voltage U remains essentially constant until rising again at instant t6 due to renewed electric current feed to piezoelectric actuator 12.

Depending on the design of fuel injector 10 and/or its hydraulic components, other operating states that may occur and are associated with characteristic changes in the trigger voltage may be detected by the method according to example embodiments of the present invention and their actual chronological occurrence may be advantageously made the object of corresponding regulating methods, preferably with the goal of finding an equivalency over multiple fuel injectors 10.

What is claimed is:

1. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein the trigger voltage is sampled at a fixed sampling frequency, and the variable depending on the second time derivative of the trigger voltage is formed from the sampling values thereby obtained, and wherein at least one of an inflection point, an extreme, and a maximum of at least one of (a) the second time derivative of the trigger voltage and (b) the variable depending on the second time derivative of the trigger voltage is regulated to a constant instant with regard to a start of triggering.

2. The method according to claim 1, wherein the fuel injector is arranged as a fuel injector of an internal combustion engine of a motor vehicle.

3. The method according to claim 1, wherein at least one of (a) a zero crossing of the second time derivative and (b) a zero crossing of the second time derivative from positive to negative values is at least one of (a) ascertained and (b) ascertained during opening of the fuel injector to infer a characteristic operating state.

4. The method according to claim 1, wherein a maximum of the second time derivative is ascertained during closing of the fuel injector to infer a characteristic operating state.

5. The method according to claim 1, wherein an operation of the fuel injector is regulated as a function of at least one of (a) the analysis of the second time derivative of the trigger voltage and (b) the variable depending on the second time derivative of the trigger voltage.

6. The method according to claim 1, wherein the analysis is performed only in at least one predefinable time window.

7. The method according to claim 1, wherein a charging time for which the piezoelectric actuator is charged is predefined.

8. A system, comprising:

a control adapted to perform a method for operating a fuel injector having a piezoelectric actuator for driving a valve needle coupled to the actuator, the method including:

analyzing a trigger voltage of the piezoelectric actuator to infer an operating state of the fuel injector; and analyzing at least one of (a) a second time derivative of the trigger voltage and (b) a variable depending on the second time derivative of the trigger voltage;

wherein the trigger voltage is sampled at a fixed sampling frequency, and the variable depending on the second time derivative of the trigger voltage is formed from the sampling values thereby obtained, and wherein at least one of an inflection point, an extreme, and a maximum of at least one of (a) the second time derivative of the trigger voltage and (b) the variable depending on the second time derivative of the trigger voltage is regulated to a constant instant with regard to a start of triggering.

9. The system of claim 8, wherein the trigger voltage is sampled at a fixed sampling frequency, and wherein the variable depending on the second time derivative of the trigger voltage is formed from the sampling values thereby obtained.

10. The system of claim 8, wherein an operation of the fuel injector is regulated as a function of at least one of (a) the analysis of the second time derivative of the trigger voltage and (b) the variable depending on the second time derivative of the trigger voltage.

11. The system of claim 8, wherein an operation of the fuel injector is regulated as a function of at least one of the analysis of (a) the second time derivative of the trigger voltage and (b) the variable depending on the second time derivative of the trigger voltage, and wherein at least one of (a) a charging current and (b) a discharge current with which the piezoelectric actuator is at least one of (a) charged and (b) discharged is predefined.

12. A system, comprising:

a control adapted to perform a method for operating a fuel injector having a piezoelectric actuator for driving a valve needle coupled to the actuator, the method including:

analyzing a trigger voltage of the piezoelectric actuator to infer an operating state of the fuel injector; and analyzing at least one of (a) a second time derivative of the trigger voltage and (b) a variable depending on the second time derivative of the trigger voltage;

wherein the trigger voltage is sampled at a fixed sampling frequency, and the variable depending on the second time derivative of the trigger voltage is formed from the sampling values thereby obtained, wherein the variable depending on the second time derivative of the trigger voltage is obtained by the following equation:

$$ddu[k]=(u[k+j]-u[k+1])-(u[k]-u[k-j+1]), \text{ and}$$

wherein u[k] is a sampling value for the trigger voltage at a discrete instant k, and j is a predefinable constant.

13. The system according to claim 12, wherein j is a predefinable constant for which it holds that j=5.

14. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein an operation of the fuel injector is regulated as a function of at least one of the analysis of (a) the second time derivative of the trigger voltage and (b) the variable depending on the second time derivative of the trigger voltage, and wherein at least one of an inflection point, an extreme, and a maximum of at least one of (a) the second time derivative of the trigger voltage and (b) the variable depending on the second time derivative of the trigger voltage is regulated to a constant instant with regard to a start of triggering, wherein the variable depending on the second time derivative of the trigger voltage is obtained by the following equation:

$$ddu[k]=(u[k+j]-u[k+1])-(u[k]-u[k-j+1]),\text{ and}$$

wherein u[k] is a sampling value for the trigger voltage at a discrete instant k, and j is a predefinable constant.

15. The method according to claim 14, wherein j is a predefinable constant for which it holds that j=5.

16. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein an operation of the fuel injector is regulated as a function of at least one of the analysis of (a) the second time derivative of the trigger voltage and (b) the variable depending on the second time derivative of the trigger voltage, and wherein at least one of (a) a charging current and (b) a discharge current with which the piezoelectric actuator is at least one of (a) charged and (b) discharged is predefined, wherein the variable depending on the second time derivative of the trigger voltage is obtained by the following equation:

$$ddu[k]=(u[k+j]-u[k+1])-(u[k]-u[k-j+1]),\text{ and}$$

wherein u[k] is a sampling value for the trigger voltage at a discrete instant k, and j is a predefinable constant.

17. The method according to claim 16, wherein j is a predefinable constant for which it holds that j=5.

18. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein the trigger voltage is sampled at a fixed sampling frequency, and the variable depending on the second time derivative of the trigger voltage is formed from the sampling values thereby obtained, wherein the variable depending on the second time derivative of the trigger voltage is obtained by the following equation:

$$ddu[k]=(u[k+j]-u[k+1])-(u[k]-u[k-j+1]),\text{ and}$$

wherein u[k] is a sampling value for the trigger voltage at a discrete instant k, and j is a predefinable constant for which it holds that j=5.

19. A method for operating a fuel injector having a piezoelectric actuator for driving a valve needle coupled to the actuator, comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein an operation of the fuel injector is regulated as a function of at least one of (a) the analysis of the second time derivative of the trigger voltage and (b) the variable depending on the second time derivative of the trigger voltage, wherein at least one of (a) a charging current and (b) a discharge current with which the piezoelectric actuator is at least one of (a) charged and (b) discharged is predefined, and wherein at least one of an inflection point, an extreme, and a maximum of at least one of (a) the second time derivative of the trigger voltage and (b) the variable depending on the second time derivative of the trigger voltage is regulated to a constant instant with regard to a start of triggering.

20. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein an operation of the fuel injector is regulated as a function of at least one of (a) the analysis of the second time derivative of the trigger voltage and (b) the variable depending on the second time derivative of the trigger voltage, and wherein at least one of an inflection point, an extreme, and a maximum of at least one of (a) the second time derivative of the trigger voltage and (b) the variable depending on the second time derivative of the trigger voltage is regulated to a constant instant with regard to a start of triggering.

21. A method for operating a fuel injector having a piezoelectric actuator for driving a valve needle coupled to the actuator, the method comprising:

analyzing a trigger voltage of the piezoelectric actuator to infer an operating state of the fuel injector; and analyzing at least one of (a) a second time derivative of the trigger voltage and (b) a variable depending on the second time derivative of the trigger voltage, wherein the trigger voltage is sampled at a fixed sampling frequency, and the variable depending on the second time derivative of the trigger voltage is formed from the sampling values thereby obtained, wherein the variable depending on the second time derivative of the trigger voltage is obtained by the following equation:

$$ddu[k]=(u[k+j]-u[k+1])-(u[k]-u[k-j+1]),\text{ and}$$

wherein u[k] is a sampling value for the trigger voltage at a discrete instant k, and j is a predefinable constant.

* * * * *

UNITED STATES PATENT AND TRADEMARK OFFICE

CERTIFICATE OF CORRECTION

PATENT NO. : 8,483,933 B2
APPLICATION NO. : 12/304529
DATED : July 9, 2013
INVENTOR(S) : Lehr et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 792 days.

Signed and Sealed this
Eighth Day of September, 2015

Michelle K. Lee
*Director of the United States Patent and Trademark Office*